US010823459B1

(12) United States Patent
Freeman

(10) Patent No.: US 10,823,459 B1
(45) Date of Patent: Nov. 3, 2020

(54) SOLAR THERMAL COLLECTING SYSTEM

(71) Applicant: Walter B. Freeman, Cave Junction, OR (US)

(72) Inventor: Walter B. Freeman, Cave Junction, OR (US)

( * ) Notice: Subject to any disclaimer, the term of this patent is extended or adjusted under 35 U.S.C. 154(b) by 194 days.

(21) Appl. No.: 16/038,917

(22) Filed: Jul. 18, 2018

Related U.S. Application Data

(60) Provisional application No. 62/540,234, filed on Aug. 2, 2017.

(51) Int. Cl.
| | |
|---|---|
| *F24J 2/04* | (2006.01) |
| *F24S 10/70* | (2018.01) |
| *H01L 31/048* | (2014.01) |
| *H02S 40/22* | (2014.01) |
| *H01L 31/054* | (2014.01) |
| *F24S 23/30* | (2018.01) |

(52) U.S. Cl.
CPC ............... *F24S 10/70* (2018.05); *F24S 23/30* (2018.05); *H01L 31/048* (2013.01); *H01L 31/0543* (2014.12); *H01L 31/0547* (2014.12); *H02S 40/22* (2014.12)

(58) Field of Classification Search
CPC .............................. F24S 10/70; H01L 31/0543
USPC ......................................... 126/646, 640, 569
See application file for complete search history.

(56) References Cited

U.S. PATENT DOCUMENTS

| | | | |
|---|---|---|---|
| 2,133,649 A | 3/1935 | Abbot | |
| 2,182,222 A | 11/1936 | Courtis et al. | |
| 4,080,954 A | 3/1978 | De Wilde et al. | |
| 4,096,861 A | 6/1978 | Bowles | |
| 4,098,265 A | 7/1978 | Gravely | |
| 4,127,103 A | 11/1978 | Klank et al. | |
| 4,143,389 A | 3/1979 | Koike et al. | |
| 4,158,356 A | 6/1979 | Wininger | |
| 4,217,885 A | 8/1980 | Bowles | |
| 4,378,789 A * | 4/1983 | Vironneau | F24S 80/70 126/654 |
| 5,275,150 A * | 1/1994 | Lai | F24S 80/54 126/692 |
| 5,680,734 A | 10/1997 | Magee | |

(Continued)

*Primary Examiner* — Avinash A Savani

(74) *Attorney, Agent, or Firm* — Jeffrey Haynes Law

(57) ABSTRACT

A solar thermal collecting system captures solar radiation into a vessel containing an opaque or partially opaque fluid medium. The solar radiation is reflected and intensified using interior parabolic reflectors inside the vessel to generate hot zones throughout the fluid medium; and the generated heat in the fluid medium is transported to a separate system designed to utilize the heat with minimal heat loss. The system of the present invention comprises a vessel that contains the fluid medium. An at least partially transparent or translucent lid enables passage of solar radiation into the vessel. The lid may have integrated solar panels to generate power from solar radiation. Multiple reflective parabolic reflectors integrated in the vessel focus solar radiation throughout the fluid medium to create hot zones that intensifies heating the fluid medium. The vessel is resilient to withstand variances in pressure and temperature. After fluid medium absorbs heat, an insulated conduit transports the heated fluid medium for storage or other beneficial uses such as conversion to power with minimal heat loss.

11 Claims, 5 Drawing Sheets

(56) References Cited

U.S. PATENT DOCUMENTS

| | | | |
|---|---|---|---|
| 8,547,669 B2 | 10/2013 | Larson et al. | |
| 2004/0011395 A1* | 1/2004 | Nicoletti | F24S 30/45 136/246 |
| 2012/0152318 A1* | 6/2012 | Kee | H02S 20/10 136/246 |
| 2014/0251414 A1* | 9/2014 | Shown | A61K 31/585 136/248 |
| 2015/0345825 A1* | 12/2015 | Harel | F24H 1/08 392/443 |
| 2016/0161726 A1 | 6/2016 | Chen et al. | |

* cited by examiner

SOLAR THERMAL COLLECTING SYSTEM

CROSS-REFERENCE TO RELATED APPLICATIONS

This application claims priority from U.S. Provisional Application Ser. No. 62/540,234, entitled "Solar Thermal Collecting System", filed on Aug. 2, 2017, which application is hereby incorporated herein by reference in its entirety.

FIELD OF THE INVENTION

The present invention relates generally to a solar thermal collecting system. More so, the present invention relates to a solar thermal collecting system that captures solar radiation and transforms it into heat energy.

BACKGROUND OF THE INVENTION

Various devices have been developed for collecting solar heat in order to render it usable either directly or as a supplement to fuel energy for heating a fluid medium. Many of the known devices would provide radiation-receptive panels inclined across the path of sunlight, together with a means for collecting heat absorbed by the panels, or radiation passed through them, in a liquid carrying the heat away for utilization.

Those skilled in the art will recognize that solar thermal collectors absorb radiant energy of sunlight and transfer it into thermal energy, then using the thermal energy to heat water or a heat transfer medium for subsequent applications. The solar thermal collector is generally configured with a solar selective coating for absorbing solar radiant energy and converting the solar radiant energy into thermal energy.

Numerous attempts have been made to develop a solar thermal collecting system that captures solar radiation and transforms it into heat energy. Even though these innovations may be suitable for the specific purposes to which they address, however, they would not be suitable for the purposes of the present invention.

For example, U.S. Pat. No. 2,133,649 to Abbot discloses a solar heater apparatus that may be used for the production of power in steam engines, wherein the apparatus comprises a frame, a ray-collector and a ray-absorber containing an opaque liquid mounted on said frame.

U.S. Pat. No. 2,182,222 to Courtis et al. teaches an apparatus for collecting and utilizing radiant solar energy. The apparatus comprises an adjustable parabolic reflector, an insulated tube rigidly supported in the focal line of the reflector, such that the relationship of the tube with respect to the focal line of the reflector remains unchanged, a means for circulating energy collecting fluid through said tube and a heat exchanger for receiving the circulated fluid and for extracting heat therefrom.

U.S. Pat. No. 4,080,954 to De Wilde et al. describes a solar collector apparatus comprising a panel of blackened heat absorbing glass tubes connected in series, each tube having a cylindrical glass jacket with a half circular concave cylindrical reflector on its inner surface, wherein each glass tube lies in the focal plane of the reflector, thereby allowing it to circulate heat storing fluid in and out of the jacket.

U.S. Pat. Nos. 4,096,861 and 4,217,885 to Bowles disclose an apparatus for collecting solar heat. The apparatus comprises a thin receptor panel adapted to be supported at an inclination across the path of sunlight directly into a layer of liquid held against and flowable only upwardly along the panel in shallow channels extending between upper and lower plenum spaces in a receptor chamber. The total volume of liquid filling the system is small in relation to the exposed receptor surface area that little sun time is lost in bringing the system to a relatively high temperature for delivery of the collected heat.

U.S. Pat. No. 4,098,265 to Gravely describes a solar energy collector which utilizes a shallow, open-topped, foamed, integrally skinned or otherwise sealed plastic vessel with a multiple layer, light transmissive cover. An opaque, preferably black, liquid is utilized as the absorbing material which is circulated in direct contact with the cover and then to a heat exchanger immersed in a heat storage medium to release its collected energy for later use.

U.S. Pat. No. 4,127,103 to Klank et al. teaches a heat collecting and transferring apparatus and systems adapted for use with solar energy comprises transparent plates covering a completely liquid filled chamber which has a heat absorbing layer as the internal surface of the chamber. The liquid is transparent and capable of absorbing, storing and/or transporting the heat energy. A compartmentalized tank can be employed to enhance heat collection efficiency.

U.S. Pat. No. 4,158,356 to Klank et al. teaches a self-powered automatic tracking solar collector. A reflective concave surface with cylindrical symmetry and a cross-sectional parabolic configuration provides concentrated solar radiation at a transducer. Furnaces with an expandable fluid on either side of the focal line of the parabola connect to pistons to orient the collector.

U.S. Pat. No. 5,680,734 to Magee teaches a solar energy control film having lenses formed therein which allow passage of light (solar radiation) through to an absorbing heat collector only for rays impinging on the structure at a low elevation angle corresponding to wintertime solar elevation at the latitude at which the structure is located. The film having a multiplicity of lenticular lenses formed on one side of the panel and on the opposite side of the panel a plurality of indentations appropriately in register with the lenticular lenses, further the indentations in the film are filled with an opaque liquid material.

U.S. Pat. No. 8,547,669 to Larson et al. teaches a photovoltaic system for generating electrical power. The photovoltaic system includes one or more solar panels, and one or more shuttering assemblies, each of which is configured to selectively limit the quantity of light received by one or more of the solar panels.

U.S. Pat. Application No. 20,160,161,726 to Chen et al. describes a multi-spiral optical device which includes a base and a plurality of spiral channels. The multi-spiral optical device can form a light concentrating device. In addition, a fluid can be filled to or drawn from one or more of the plurality of spiral channels for switching the optical state of the multi-spiral optical device, allowing the device to be used for a light-pervious, a sheltering, or a light-concentrating state according to users' requirements.

It is apparent now that numerous innovations that are adapted to a solar thermal collecting method and system that captures solar radiation and transforms it into heat energy have been developed in the prior art that are adequate for various purposes. Furthermore, even though these innovations may be suitable for the specific purposes to which they address, accordingly, they would not be suitable for the purposes of the present invention as heretofore described. Thus a solar thermal collecting system that uses at least several parabolic reflectors in a predetermined arrangement so as to optimize capture of solar radiation and transforming it into heat energy is needed.

SUMMARY OF THE INVENTION

The present invention relates to a solar thermal collecting system that captures solar radiation and transforms it into heat energy; whereby the system provides a vessel that contains an opaque or partially opaque fluid medium that is defined by a predetermined thermal capacity; whereby the vessel comprises an at least partially transparent or translucent lid which in some applications include an integrated solar panel, which enables passage of solar radiation into the fluid medium; whereby multiple reflective parabolic mirrors integrated in the inner sidewalls of the vessel focus the solar radiation throughout the fluid medium to create hot zones therein; and whereby the heated fluid medium is transported for storage, or to a heat exchanger, or a boiler or to an energy recovery assembly adapted to produce power from low intensity thermal sources or to transfer heat for subsequent beneficial use with minimal heat loss; and whereby the fluid medium is carried in an insulated conduit to minimize loss of heat during transport.

According to an aspect of the present invention, a solar thermal collecting system, includes a vessel defined by an inner sidewall, an outer sidewall, and an opening, the sidewalls forming a cavity, the vessel being resilient to withstand variances in pressure and temperature; an opaque or partially opaque fluid medium defined by a predetermined thermal capacity, the fluid medium disposed to at least partially fill the cavity of the vessel; a lid covering the opening in the vessel, the lid defined by an at least partially transparent or translucent lid, whereby the lid enables passage of solar radiation into the cavity; multiple mirrors/reflective surfaces integrated into the inner sidewall of the vessel, the mirrors focusing the solar radiation throughout the fluid medium to create hot zones in the fluid medium, the hot zones heating the fluid medium to the predetermined thermal capacity; an insulated conduit in communication with the vessel, the insulated conduit carrying the heated fluid medium to a second vessel for storage, or to a heat exchanger, or a boiler or to an energy recovery assembly adapted to produce power from low intensity thermal sources, whereby the insulation minimizes the amount of heat lost during transport of the fluid medium.

In view of the foregoing, it is therefore an objective of the present invention to provide a solar thermal collecting system that enhances the heat generated in the vessel through use of multiple parabolic mirrors that focus the solar radiation onto the fluid medium to create hot zones.

Another objective is to provide a lid that is at least partially transparent or translucent, so as to optimize the amount of solar radiation entering the vessel.

Yet another objective is to quickly transport the heated medium for storage to a boiler or energy conversion with minimal loss of heat through an insulated conduit.

Yet another objective is to manufacture an inexpensive solar thermal collector.

Other objectives and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The invention will now be described, by way of example, with reference to the accompanying drawings, in which.

Like reference numerals refer to like parts throughout the various views of the drawings.

DETAILED DESCRIPTION OF THE INVENTION

Figure 1:
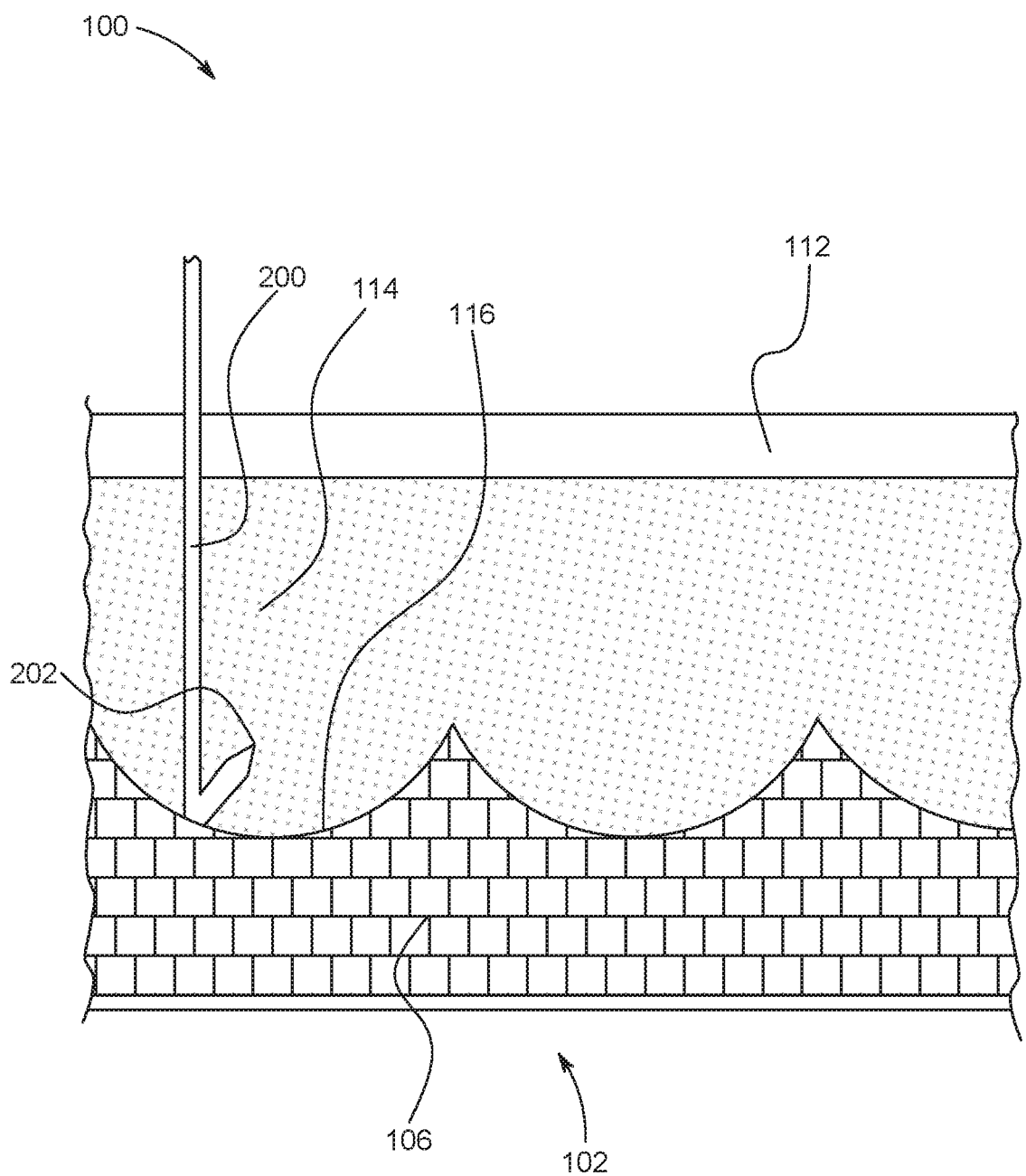
FIG. 1 illustrates a sectioned side view of an exemplary solar thermal collecting system, in accordance with an embodiment of the present invention.

The following detailed description is merely exemplary in nature and is not intended to limit the described embodiments or the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to make or use the embodiments of the disclosure and are not intended to limit the scope of the disclosure, which is defined by the claims. For purposes of description herein, the terms "upper," "lower," "left," "rear," "right," "front," "vertical," "horizontal," and derivatives thereof shall relate to the invention as oriented in FIG. 1. Furthermore, there is no intention to be bound by any expressed or implied theory presented in the preceding technical field, background, brief summary or the following detailed description. It is also to be understood that the specific devices and processes illustrated in the attached drawings, and described in the following specification, are simply exemplary embodiments of the inventive concepts defined in the appended claims. Specific dimensions and other physical characteristics relating to the embodiments disclosed herein are therefore not to be considered as limiting, unless the claims expressly state otherwise.

A solar thermal collecting system 100 is referenced in FIGS. 1-5. The solar thermal collecting system 100, hereafter "system 100" is configured to enhance capturing of solar radiation 200 from the sun into a vessel 102 containing an opaque or partially opaque fluid medium 114; and further reflecting the solar radiation off of parabolic reflectors 116 inside the vessel 102, such that a pluralities of parabolic foci 202 of solar radiation 200 generates hot zones throughout the fluid medium 11. The heated fluid medium 114 is then used to produce power or to transfer heat for subsequent beneficial use with minimal heat loss. In some applications, the heated fluid medium may be stored in an appropriate storage vessel or system of known construct for subsequent use to produce power. In some applications, it may be further heated in a boiler.

According to one aspect of the present invention, a solar thermal collecting system 100 comprising: a vessel 102 defined by an inner sidewall 104, an outer sidewall 106, and an opening 108, the sidewalls 104, 106 forming a cavity 110; a lid 112 covering the opening 108 in the vessel 102, the lid 112 defined by an at least partially transparent or translucent lid, whereby the lid 112 enables passage of solar radiation into the cavity 110; an at least partially opaque fluid medium 114 defined by a predetermined thermal capacity, wherein the fluid medium 114 at least partially fill the cavity 110 of the vessel 102; multiple reflectors 116 integrated into the inner sidewall 104 of the vessel 102, the reflectors 116a-c creates a plurality of foci 202 of solar radiation 200 throughout the fluid medium 114 that intensifies the heat being generated in the fluid medium 114 so as to create hot zones in the fluid medium 114, the hot zones allows to heat the fluid medium 114 to the predetermined thermal capacity; and an insulated outlet conduit 118 in communication with the vessel 102, the insulated outlet conduit 118 carrying the heated fluid medium to a second vessel (not shown) for storage, or to a heat exchanger (not shown), or a boiler (not shown) or to an energy recovery assembly (not shown).

In another aspect, the at least partially opaque fluid medium 114 is selected from the group consisting of water, water and dye, water and black carbon, oil, ethylene glycol, and a liquid or gel having a thermal capacity greater than 2 J/g C°.

In another aspect, the vessel 102 is made of resilient material is selected from the group consisting of a polymer or rubber to withstand variances in pressure and temperature generated in the fluid medium 114 due to absorption of the solar radiation 200.

In another aspect, the multiple reflectors 116 are parabolic mirrors.

In another aspect, the vessel 102 is insulated.

In another aspect, the system 100 further comprises at least one solar photovoltaic panel 120 operational on the lid 112 of the vessel 102, the solar photovoltaic panel 120 converting the solar radiation to power.

In another aspect, the solar panel is a photovoltaic cell.

In another aspect, the system 100 further comprises a pump 124 to move the fluid medium 114 through the system 100.

In another aspect, the system 100 further comprises an inflow tube 122 for carrying the fluid medium 114 to the cavity 110 of the vessel 102.

In another aspect, a solar thermal collecting system 100, the system 100 comprising: a vessel 102 defined by an inner sidewall 104, an outer sidewall 106, and an opening 108, the sidewalls 104, 106 forming a cavity 110, wherein the outer sidewall 106 of the vessel 102 is insulated; a lid 112 covering the opening 108 in the vessel 102, the lid 112 defined by an at least partially transparent or translucent lid, whereby the lid 112 enables passage of solar radiation 200 into the cavity 110, further the lid 112 may include integrated one or more solar panels 120 to generate electrical power directly from the solar radiation 200; an at least partially opaque fluid medium 114 defined by a predetermined thermal capacity; an inflow conduit 122 supplies the fluid medium 114 to at least partially fill the cavity 110 of the vessel 102; multiple parabolic reflectors 116 integrated into the inner sidewall 104 of the vessel 102, the parabolic configuration of the reflectors 116 creates a parabolic focus 202 of solar radiation 200 throughout the fluid medium 114 that intensifies the heat being generated in the fluid medium 114 so as to create hot zones in the fluid medium 114, the hot zones allows to heat the fluid medium 114 to the predetermined thermal capacity; and an insulated outlet conduit 118 in communication with the vessel 102, the insulated outlet conduit 118 carrying the heated fluid medium 114 to a second vessel for storage, or to a heat exchanger, or a boiler or to an energy recovery assembly.

In another aspect, the parabolic reflectors 116 are selected from the group consisting of: parabolic mirrors or parabolic surfaces coated with reflective paint or foil.

As referenced in FIG. 1, the system 100 provides a vessel 102 that contains an opaque or partially opaque fluid medium 114. The fluid medium 114 is defined by a predetermined thermal capacity that stores heat energy generated from the solar radiation 200. The vessel 102 is sufficiently resilient, so as to withstand variances in pressure and temperature.

The vessel 102 also comprises an at least partially transparent or translucent lid 112 that is configured to enable passage of solar radiation 200 into the vessel 102; and thereby the fluid medium 114. In alternative embodiments, the lid 112 may include integrated solar panels 120 to generate power directly from the solar radiation 200.

The inner sidewalls 104 of the vessel 102 comprise multiple reflective parabolic surfaces or parabolic mirrors 116 integrated in the inner sidewalls 104 of the vessel 102. The parabolic mirrors/reflective surfaces 116 focus the solar radiation 200 throughout the fluid medium 114 to create hot zones therein. The parabolic configuration of the mirrors 116 creates at least one parabolic focus 202 of solar radiation that intensifies the heat being generated in the fluid 114.

After absorbing a predetermined quantity of heat, an insulated conduit 118 transports the heated fluid medium 114 to a second vessel (not shown) for storage, or to a heat exchanger/boiler, or to an energy recovery assembly adapted to produce power from low intensity thermal sources or to transfer heat for subsequent beneficial use with minimal heat loss. The insulation minimizes the amount of heat lost during transport of the fluid medium 114.

Figure 2A:
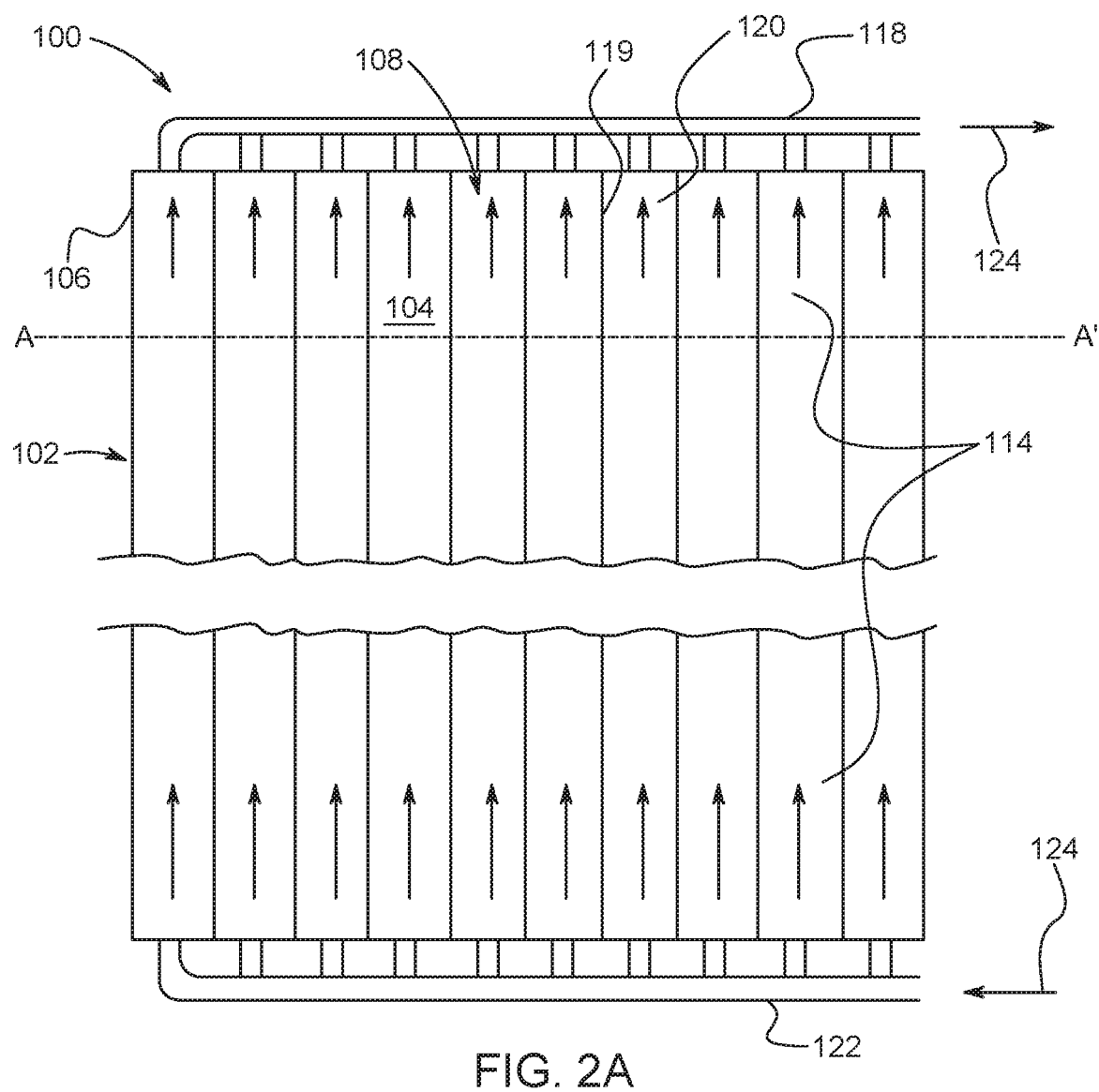
FIG. 2A illustrates a top perspective view of a solar thermal collecting system, in accordance with an embodiment of the present invention.

According to an embodiment of the present invention as illustrated in FIG. 2A, showing the top view of the system 100 comprises a vessel 102. The vessel 102 provides the means for storing an opaque or partially opaque fluid medium 114 that is heated by solar radiation and then transported the heated fluid medium for several uses such as for conversion to power. The vessel 102 is defined by an inner sidewall 104, an outer sidewall 106, and an opening 108. The sidewalls 104, 106 form a cavity 110 that is sized and dimensioned to store the fluid medium 114, wherein the system 100 may further comprising an inflow tube 122 for carrying the fluid medium 114 to the cavity 110 of the vessel 102 and an insulated outflow tube 118 for carrying the heated fluid medium 114 out of the cavity 110 of the vessel 102. Further the system 100 comprises at least one pump 124 to move the fluid medium 114 through the system 100. In some embodiments, the vessel 102 may have a cylindrical shape, a rectangular shape, or any shape that is effective for storing the fluid medium 114. Further according to an exemplary embodiment, the inner sidewall 104 of the vessel 102 comprises multiple rows of longitudinal ridges 119 forming pluralities of longitudinal parabolic/concave grooves, which are mirrored or painted or suitably coated with reflective surfaces to act as multiple longitudinal parabolic mirrors/reflectors 116 to create a plurality of foci 202 of solar radiation 200 throughout the fluid medium 114 that intensifies the heat being generated in the fluid medium 114 so as to create hot zones in the fluid medium 114, the hot zones allows to heat the fluid medium 114 to the predetermined thermal capacity.

Figure 2B:
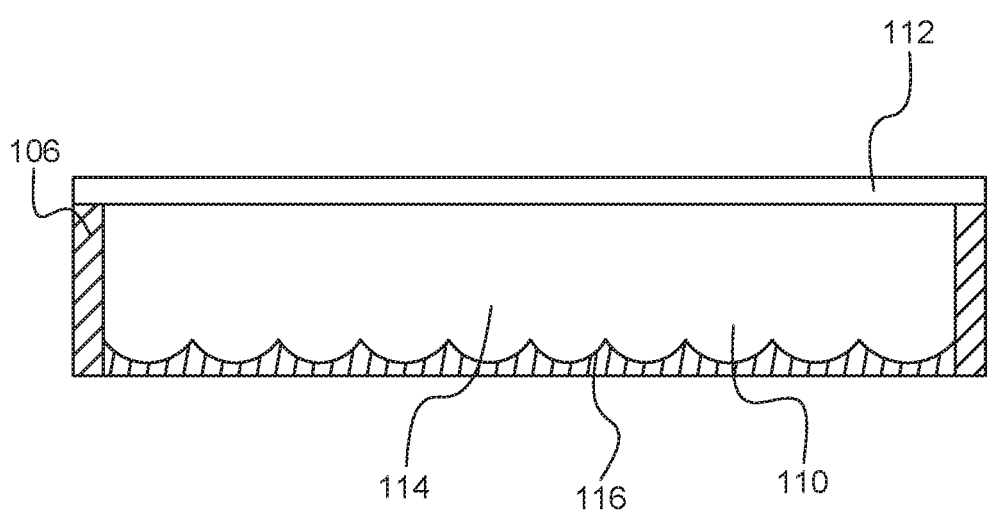
FIG. 2B illustrates a sectioned side view of the solar thermal collecting system, the section taken along section A-A of FIG. 2A, illustrating formation of troughs that act as parabolic reflectors in the vessel, in accordance with an embodiment of the present invention.

As FIG. 2B shows a transverse side cross sectional view along AA' line, as shown in FIG. 2A illustrating the vessel 102 defined by the inner sidewall 104, the outer sidewall 106, and the opening 108, wherein the sidewalls 104, 106 form a cavity 110, further an at least partially transparent or translucent lid 112 covers the opening 108 in the vessel 102. The inner side wall 104 shows formation of plurality of parabolic reflecting surfaces 116 while the outer sidewall 106 is insulated to prevent heat loss. The vessel 102 is resilient to withstand variances in pressure and temperature. The vessel stores a fluid member with a high thermal capacity greater than 2 J/g C°, while also receiving concentrated amounts of solar radiation. This resilience may be possible through construction with a flexible material, such as a polymer or rubber. Thus, the vessel 102 is constructed to withstand pressure generated by the expansion and evaporation of the fluid medium 114. The vessel 102 is also insulated to help retain the heat generated by the fluid medium 114. The insulation may be applied to the outer sidewall 106.

Figure 3A:
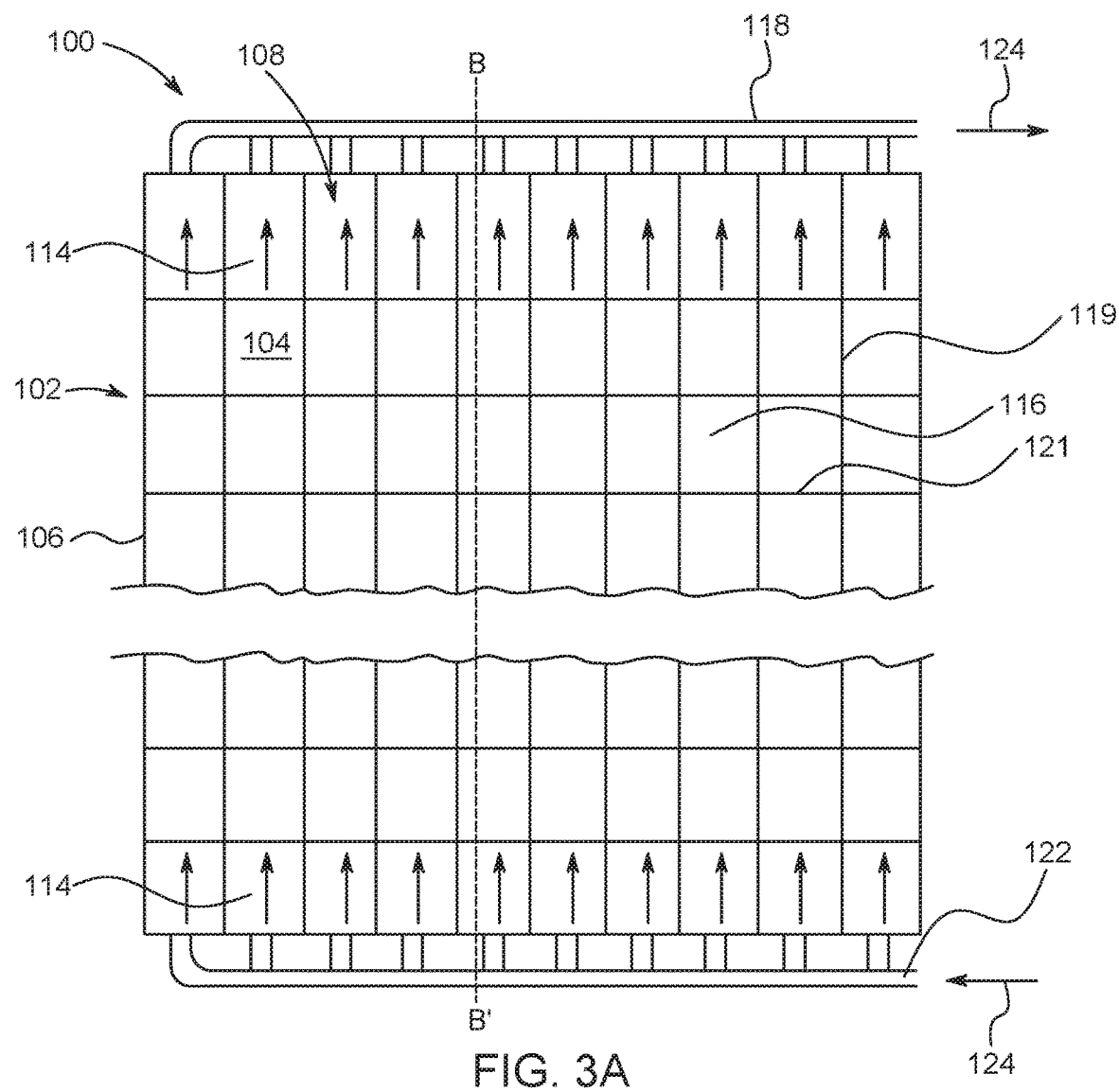
FIG. 3A illustrates a top perspective view of another embodiment of a solar thermal collecting system, in accordance with an embodiment of the present invention.
Figure 3B:
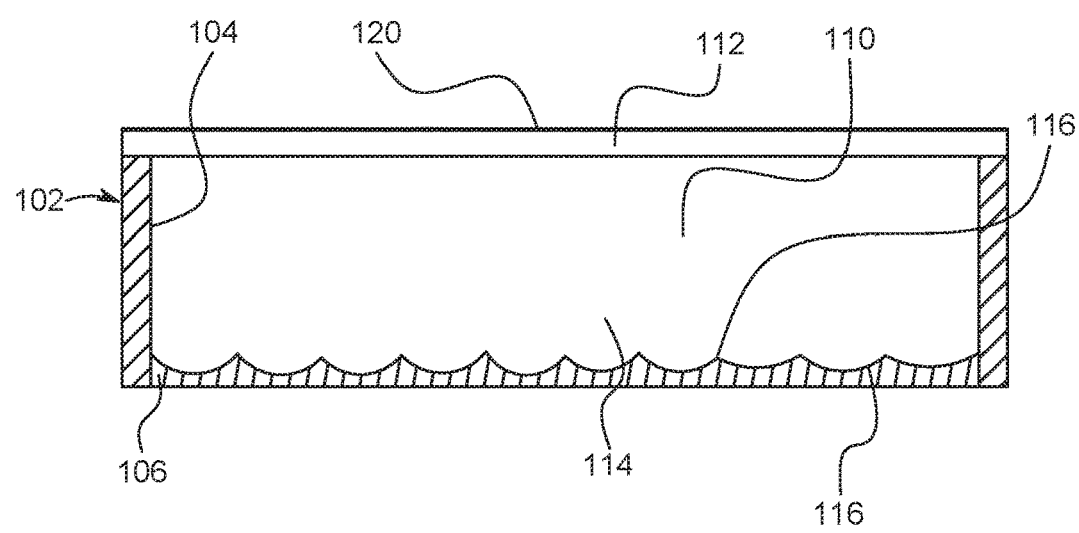
FIG. 3B illustrates a sectioned side view of the alternative solar thermal collecting system, the section taken along section B-B of FIG. 3A, illustrating formation of parabolic reflectors in the vessel and integration of solar panel to the system, in accordance with an embodiment of the present invention.

According to another embodiment of the present invention as shown in the sectioned view of the system 100 in FIGS. 3A and 3B, an inflow tube 122 carries the fluid medium 114 to the cavity 110 of the vessel 102, so as to at least partially fill the vessel 102. A pump 124 may also be used to force the fluid medium 114 through the inflow tube 122, and into the cavity 110 of the vessel 102. The pump 124 also works to move the fluid medium 114 through the system 100, and discharge the fluid medium 114 from the vessel 102 for storage and/or subsequent beneficial use such as power generation. Further the inner sidewall 104 of the vessel 102 comprises multiple rows of longitudinal 119 and transverse ridges 121 forming pluralities of parabolic/concave grooves that are mirrored or painted or suitably coated with reflective surfaces to act as multiple parabolic/concave mirrors 116 to create a plurality of foci 202 of solar radiation 200 throughout the fluid medium 114 that intensifies the heat being generated in the fluid medium 114 so as to create hot zones in the fluid medium 114, the hot zones allows to heat the fluid medium 114 to the predetermined thermal capacity.

The opaque or partially opaque fluid medium 114 is defined by a predetermined thermal capacity. Those skilled in the art will recognize that the thermal capacity of a fluid medium is the capability to absorb heat energy. And that the specific heat of the fluid medium 114 is the amount of heat, in calories, needed to raise the temperature of 1 gram of fluid by 1 Celsius. Thus, the system 100 requires a fluid medium 114 having a relatively high thermal capacity, so as to optimize heating of the fluid medium 114 contained in the vessel 102.

In one embodiment, the fluid medium 114 is water, which serves as an efficient fluid medium for purposes of the present invention. Water absorbs a high amount of heat before increasing in temperature. Water also has the highest thermal capacity of all liquids, which is about 4.184 J/g C°. In some embodiments, a dye or carbon may be mixed into the water to increase the thermal absorption.

Those skilled in the art will recognize that water's high heat capacity is a property caused by hydrogen bonding among water molecules. When heat is absorbed, hydrogen bonds are broken and water molecules can move freely. When the temperature of water decreases, the hydrogen bonds are formed and release a considerable amount of energy. The system 100 may, however, utilize other fluid mediums, including oil (thermal capacity 2.0 J/g C°), ethylene glycol (thermal capacity 2.2 J/g C°), and a liquid or gel having a thermal capacity greater than 2 J/g C°.

As FIG. 3B shows a longitudinal side cross sectional view along B-B' line, as shown in FIG. 3A illustrating the inner side wall comprising multiple parabolic reflecting surfaces 116 while the outer sidewall 106 is insulated to prevent heat loss. In order to optimize the amount of solar radiation 200 striking the fluid medium 114, an at least partially transparent or translucent lid 112 covers the opening 108 in the vessel 102 as shown in FIG. 3B. The lid 112 is configured to enable passage of solar radiation 200 into the cavity 110 for heating the fluid medium 114. In one embodiment, a solar panel 120 is operational on the lid 112 of the vessel 102 for converting the solar radiation to power. The solar panel 120 may include a photovoltaic cell or array.

Figure 4:
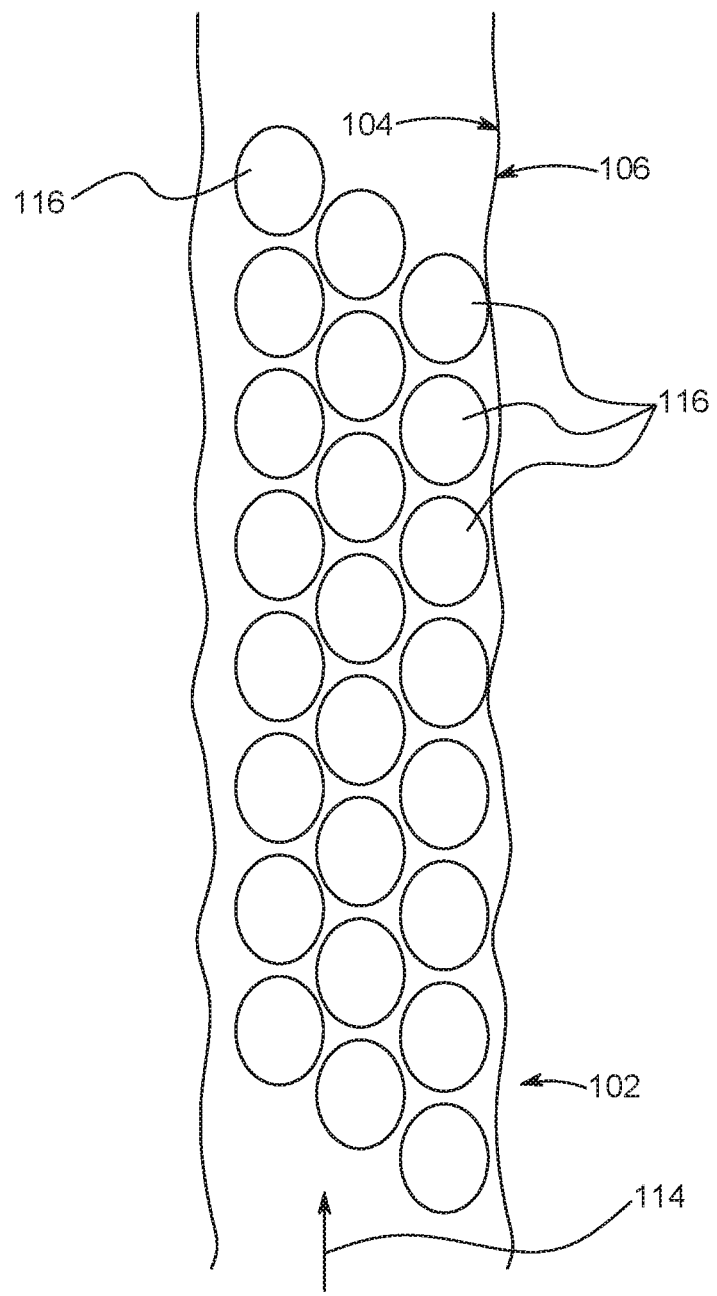
FIG. 4 illustrates a top perspective view of multiple parabolic mirrors integrated into the inner sidewall of the vessel, in accordance with an embodiment of the present invention.

According to another exemplary embodiment of the present invention as illustrated in FIG. 4, multiple mirrors/reflective surfaces 116 may be formed or integrated into the inner sidewall 104 of the vessel 102. The mirrors/reflective surfaces 116a, 116b, 116c help focus the solar radiation throughout the fluid medium 114 to create hot zones in the fluid medium 114. The hot zones heating the fluid medium 114 to the predetermined thermal capacity. In some instances the mirrors/reflective surfaces 116 form parabolic troughs that are quite large, with the surfaces coated with reflective paint or foil.

In one embodiment, the mirrors/reflective surfaces 116 are arranged as parabolic mirrors that reflect solar radiation. The mirrors 116 may have various shapes, including circular, rectangular, and square. In another embodiment shown in FIG. 4, the parabolic mirrors 116a, 116b, 116c have reflective surfaces that form a series of closely spaced individual circular reflective elements. Though the mirrors 116a-c may form other shapes.

After the fluid medium 114 is heated to an optimal temperature, an insulated conduit 118 that is in communication with the vessel 102 carries the heated fluid medium 114 to a second vessel (not shown) for storage and further heating (FIG. 2A). Or in other embodiments, the fluid medium 114 may be carried to a heat exchanger or an energy recovery assembly that is configured to produce power from low intensity thermal sources. The insulation of the conduit 118 helps minimize the amount of heat loss during transport of the fluid medium 114. The pump 124 is used to force the fluid medium into or out of the cavity 110 of the vessel 102; however other known methods and systems for moving the fluid medium 114 through the system 100 can be used in accordance with an embodiment of the present invention.

Figure 5:
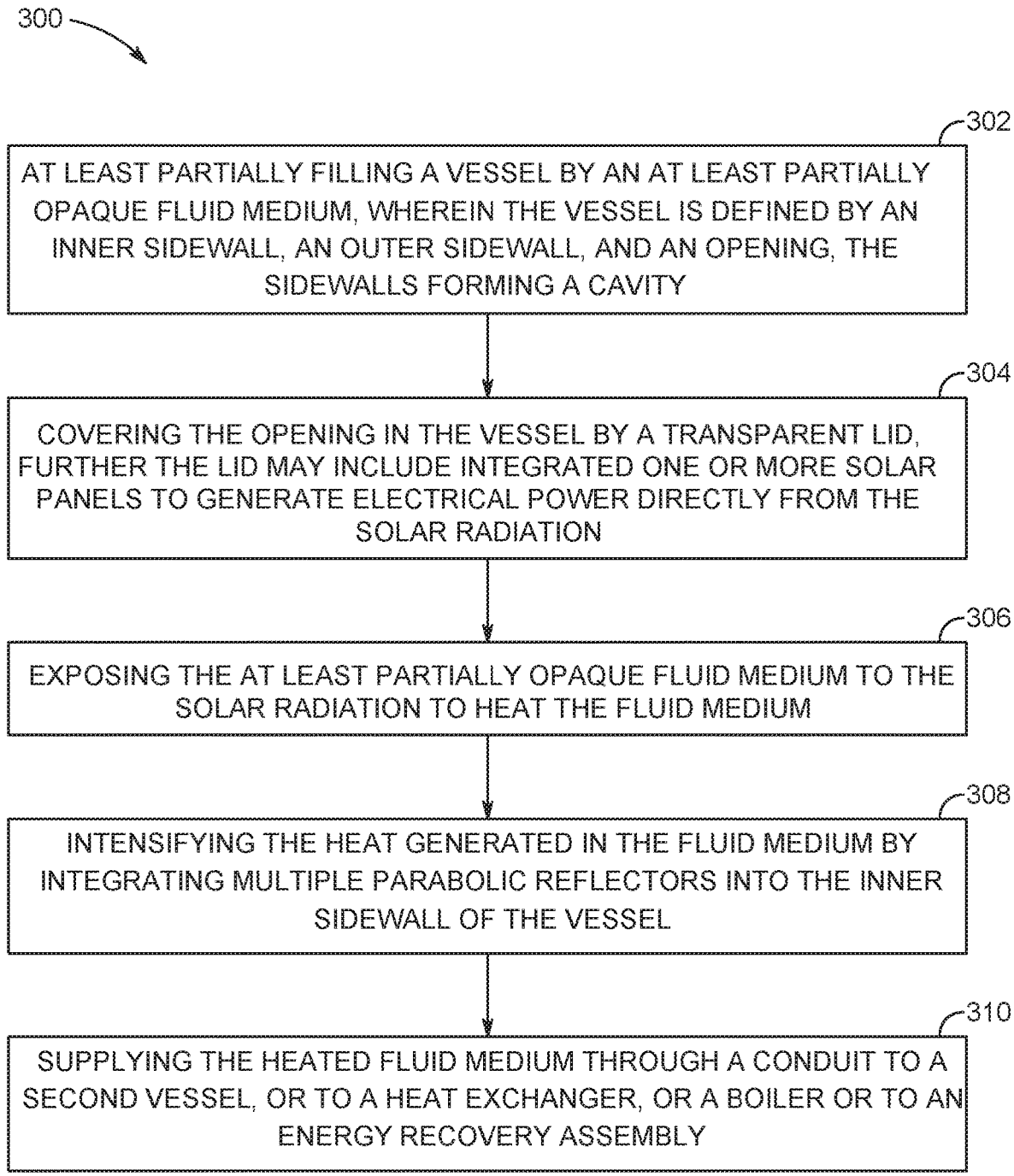
FIG. 5 illustrates a flowchart of an exemplary method of capturing solar radiation and transforming it into heat energy, in accordance with an embodiment of the present invention.

According to another aspect of the present invention as shown in FIG. 5 that illustrates a flowchart of an exemplary method 300 of capturing solar radiation and transforming it into heat energy. The method 300 may include an initial Step 302 of at least partially filling a vessel by an at least partially opaque fluid medium defined by a predetermined thermal capacity, wherein the vessel is defined by an inner sidewall, an outer sidewall, and an opening, the sidewalls forming a cavity, wherein the outer sidewall of the vessel is insulated. The method 300 may further comprise a Step 304 of covering the opening in the vessel by a transparent lid, wherein the lid enables passage of solar radiation into the cavity, further the lid may include integrated one or more solar panels to generate electrical power directly from the solar radiation. A Step 306 includes exposing the at least partially opaque fluid medium to the solar radiation to heat the fluid medium. Step 308 comprises intensifying the heat generated in the fluid medium by integrating multiple parabolic reflectors into the inner sidewall of the vessel, wherein the parabolic configuration of the reflectors creates a parabolic focus of solar radiation throughout the fluid medium that intensifies the heat being generated in the fluid medium so as to create hot zones in the fluid medium, the hot zones heating the fluid medium to the predetermined thermal capacity. A Step 310 comprises supplying the heated fluid medium through a conduit to a second vessel for storage, or to a heat exchanger, or a boiler or to an energy recovery assembly, wherein the conduit is insulated to minimize the amount of heat loss during transport of the fluid medium.

These and other advantages of the invention will be further understood and appreciated by those skilled in the art by reference to the following written specification, claims and appended drawings.

Because many modifications, variations, and changes in detail can be made to the described preferred embodiments of the invention, it is intended that all matters in the foregoing description and shown in the accompanying drawings be interpreted as illustrative and not in a limiting sense. Thus, the scope of the invention should be determined by the appended claims and their legal equivalence.

What is claimed is:

1. A solar thermal collecting system, the system comprising:
   a vessel defined by an inner sidewall, an outer sidewall, and an opening, the inner and outer sidewalls forming a cavity;
   a lid covering the opening in the vessel, the lid defined by an at least partially transparent or translucent lid, whereby the lid enables passage of solar radiation into the cavity;
   an at least partially opaque fluid medium defined by a predetermined thermal capacity, wherein the fluid medium at least partially fills the cavity of the vessel, wherein the partially opaque fluid medium comprises water mixed with carbon or dye so as to increase thermal absorption by increasing the thermal capacity of the medium to greater than 4.2 J/g C°;
   a plurality of reflectors integrated into the inner sidewall of the vessel, the reflectors create a plurality of foci of solar radiation throughout the fluid medium thereby intensifying the heat generated in the fluid medium so as to create hot zones in the fluid medium, the hot zones heating the fluid medium to the predetermined thermal capacity; and
   an insulated outlet conduit in communication with the vessel, the insulated outlet conduit carrying the heated fluid medium to a second vessel, or to a heat exchanger, or a boiler or to an energy recovery assembly.

2. The system of claim 1, wherein the vessel is made of a resilient material is a polymer or rubber capable of withstanding variances in pressure and temperature generated in the fluid medium.

3. The system of claim 1, wherein the plurality of reflectors comprise parabolic mirrors.

4. The system of claim 1, wherein the vessel is insulated.

5. The system of claim 1, wherein the system further comprises at least one solar panel operational on the lid of the vessel, the solar panel converting the solar radiation to power.

6. The solar panel of claim 5, wherein the solar panel is a photovoltaic cell.

7. The system of claim 1, wherein the system further comprises at least one pump in fluid communication with the vessel to move the fluid medium through the system.

8. The system of claim 1, wherein the system further comprises an inflow tube for carrying the fluid medium to the cavity of the vessel.

9. A solar thermal collecting system, the system comprising:
   a vessel defined by an inner sidewall, an outer sidewall, and an opening, the sidewalls forming a cavity, wherein the outer sidewall of the vessel is insulated;
   a lid covering the opening in the vessel, the lid defined by an at least partially transparent or translucent lid, whereby the lid enables passage of solar radiation into the cavity, further the lid may include one or more solar panels to generate electrical power directly from the solar radiation;
   an at least partially opaque fluid medium comprising water mixed with carbon or dye so as to increase thermal absorption by increasing the thermal capacity of the medium to greater than 4.2 J/g C°;
   an inflow conduit supplying the fluid medium to at least partially fill the cavity of the vessel;
   multiple parabolic reflectors constructed of or coated with reflective material comprising reflective paint or foil, the reflectors integrated into the inner sidewall of the vessel, the parabolic configuration of the reflectors creates one or more parabolic foci of solar radiation throughout the fluid medium that intensifies the heat being generated in the fluid medium so as to create hot zones in the fluid medium, the hot zones allows heating the fluid medium to the predetermined thermal capacity; and
   an insulated outlet conduit in communication with the vessel, the insulated outlet conduit carrying the heated fluid medium to a second vessel, or to a heat exchanger, or a boiler or to an energy recovery assembly.

10. The system of claim 9, wherein the solar panel comprises a photovoltaic cell.

11. The system of claim 9, wherein the vessel is made of a resilient material selected from capable of withstanding variances in pressure and temperature generated in the fluid medium because of absorption of the solar radiation.

* * * * *